US007049618B2

(12) United States Patent
Lyons

(10) Patent No.: US 7,049,618 B2
(45) Date of Patent: May 23, 2006

(54) VIRTUAL GAUGING METHOD FOR USE IN LITHOGRAPHIC PROCESSING

(75) Inventor: Joseph H. Lyons, Wilton, CT (US)

(73) Assignee: ASML Holding N.V., (NL)

( * ) Notice: Subject to any disclaimer, the term of this patent is extended or adjusted under 35 U.S.C. 154(b) by 0 days.

(21) Appl. No.: 11/256,938

(22) Filed: Oct. 25, 2005

(65) Prior Publication Data

US 2006/0038143 A1 Feb. 23, 2006

Related U.S. Application Data

(60) Continuation of application No. 10/890,213, filed on Jul. 14, 2004, now Pat. No. 6,979,833, which is a continuation of application No. 10/435,562, filed on May 12, 2003, now Pat. No. 6,984,836, which is a division of application No. 09/638,902, filed on Aug. 15, 2000, now Pat. No. 6,633,050.

(51) Int. Cl.
*G01J 1/20* (2006.01)
(52) U.S. Cl. ................... 250/548; 356/400; 355/53
(58) Field of Classification Search ............... 250/548; 355/53, 55, 61–63; 356/399–401
See application file for complete search history.

(56) References Cited

U.S. PATENT DOCUMENTS 5,825,043 A 10/1998 Suwa
6,057,908 A 5/2000 Ota
6,118,515 A 9/2000 Wakamoto et al.
6,122,036 A 9/2000 Yamasaki et al.
6,608,681 B1 8/2003 Tanaka et al.
6,633,050 B1 10/2003 Lyons

FOREIGN PATENT DOCUMENTS

EP 0 834 773 A2 4/1998
EP 1 052 683 A1 11/2000

OTHER PUBLICATIONS

International Search Report for International Application No. PCT/US00/40635, mailed May 28, 2001 (7 pages).

*Primary Examiner*—Stephone B. Allen
(74) *Attorney, Agent, or Firm*—Sterne, Kessler, Goldstein & Fox P.L.L.C.

(57) ABSTRACT

A virtual gauging method for use in a lithographic process includes gauging a region at a surface of a wafer when the region is located away from an axis of illumination producing wafer surface data, while other portions of the wafer are being illuminated. The method also includes acquiring time-domain measurements representing the wafer surface data and converting the time-domain measurements into space-domain measurements. This conversion can be done using a finite-impulse-response (FIR) filter. The FIR filter can be triggered with a spatial interrupt, and a width of the FIR filter is modified in response to a velocity of travel of the wafer. The method further includes converting space-domain measurements into wafer correction data.

6 Claims, 8 Drawing Sheets

AT TIME $T_1$

AT TIME $T_2$

VIRTUAL GAUGING METHOD FOR USE IN LITHOGRAPHIC PROCESSING

CROSS-REFERENCE TO RELATED APPLICATIONS

This application is a Continuation of U.S. patent application Ser. No. 10/890,213, filed Jul. 14, 2004, now U.S. Pat. No. 6,979,833, which is a Continuation of U.S. patent application Ser. No. 10/435,562, filed May 12, 2003, now U.S. Pat. No. 6,984,836, which is a Divisional of U.S. patent application Ser. No. 09/638,902, filed Aug. 15, 2000, now U.S. Pat. No. 6,633,050 B1, all of which are hereby incorporated by reference in their entireties.

BACKGROUND OF THE INVENTION

1. Field of the Invention

This invention relates generally to lithographic processing. More particularly, this invention relates to a system and method for monitoring the topography of a wafer surface during lithographic processing.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the relevant art would recognize that other substrates could be used without departing from the scope of the instant invention.

During lithography, a wafer is disposed on a wafer stage and held in place by a chuck. The chuck is typically a vacuum or electrostatic chuck capable of securely holding the wafer in place. The wafer is exposed to an image projected onto its surface by exposure optics located within a lithography apparatus. While exposure optics are used in the case of photolithography, a different type of exposure apparatus may be used depending on the particular application. For example, x-ray, ion, electron, or photon lithographies each may require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the sharpness of the image projected onto the wafer is maximized.

While using a step-and-scan technique generally assists in improving overall image sharpness, image distortions generally occur in such systems due to imperfections within the projection optics system, illumination system, and the particular reticle being used. Such image distortions are frequently due to the poor focus that results from the wafer surface being located somewhere other than in the desired focal plane of the projection optics. Since the surfaces of wafers are seldom planar, especially after multiple processing steps, focus problems are often related to the inability to know precisely how far the wafer surface is from the projection optics along the illumination axis of the lithography apparatus. This, in turn, often stems from the fact that most typical sensors or gauges used to measure the separation between the projection optics and the wafer surface cannot be located along the axis of illumination.

What is needed is a system and method that can be used to determine the separation between a wafer surface and the projection optics along the axis of illumination so that accurate focus can be maintained.

BRIEF SUMMARY OF THE INVENTION

A virtual gauging method for use in a lithographic process is described. The method includes gauging a region at a surface of a wafer when the region is located away from an axis of illumination producing wafer surface data, while other portions of the wafer are being illuminated. The method also includes acquiring time-domain measurements representing the wafer surface data and converting the time-domain measurements into space-domain measurements. In an embodiment, this conversion is done using a finite-impulse-response (FIR) filter. According to a further embodiment, the FIR filter is triggered with a spatial interrupt, and a width of the FIR filter is modified in response to a velocity of travel of the wafer. The method further includes converting space-domain measurements into wafer correction data.

In an embodiment, the method further includes adjusting a separation distance between an exposure lens and the region at the surface of the wafer based on the wafer correction data when the region is located at the axis of illumination.

According to yet another embodiment, the gauging is accomplished by at least two wafer surface gauges located on opposite sides of an illumination slot. In an embodiment that uses wafer surface gauges, the conversion of space-domain measurements into wafer correction data includes determining a direction of travel of the wafer, wherein the wafer correction data is based on data produced by one of the wafer surface gauges located on a side of the illumination slot that corresponds to the direction of travel of the wafer.

Also disclosed is a system for monitoring wafer surface topography during a lithographic process. The system includes means for capturing wafer position and surface data at a first time when a wafer is at a first location, means for generating correction data for a second wafer location prior to the wafer reaching the second wafer location, and means for storing the correction data in a spatial delay line. The means for capturing wafer position and surface data includes means for capturing backplane position data with a plurality of stalk gauges. In an embodiment, the system also includes means for moving the wafer based on the correction data when the wafer is at the second wafer location at a second time.

According to an embodiment, the means for generating correction data includes means for converting the wafer position and surface data from a time-domain into a space domain. According to another embodiment, the means for generating correction data also includes means for transforming at least some of the wafer position and surface data from a first coordinate system into a second coordinate system such that all of the wafer position and surface data is associated with a single coordinate system.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
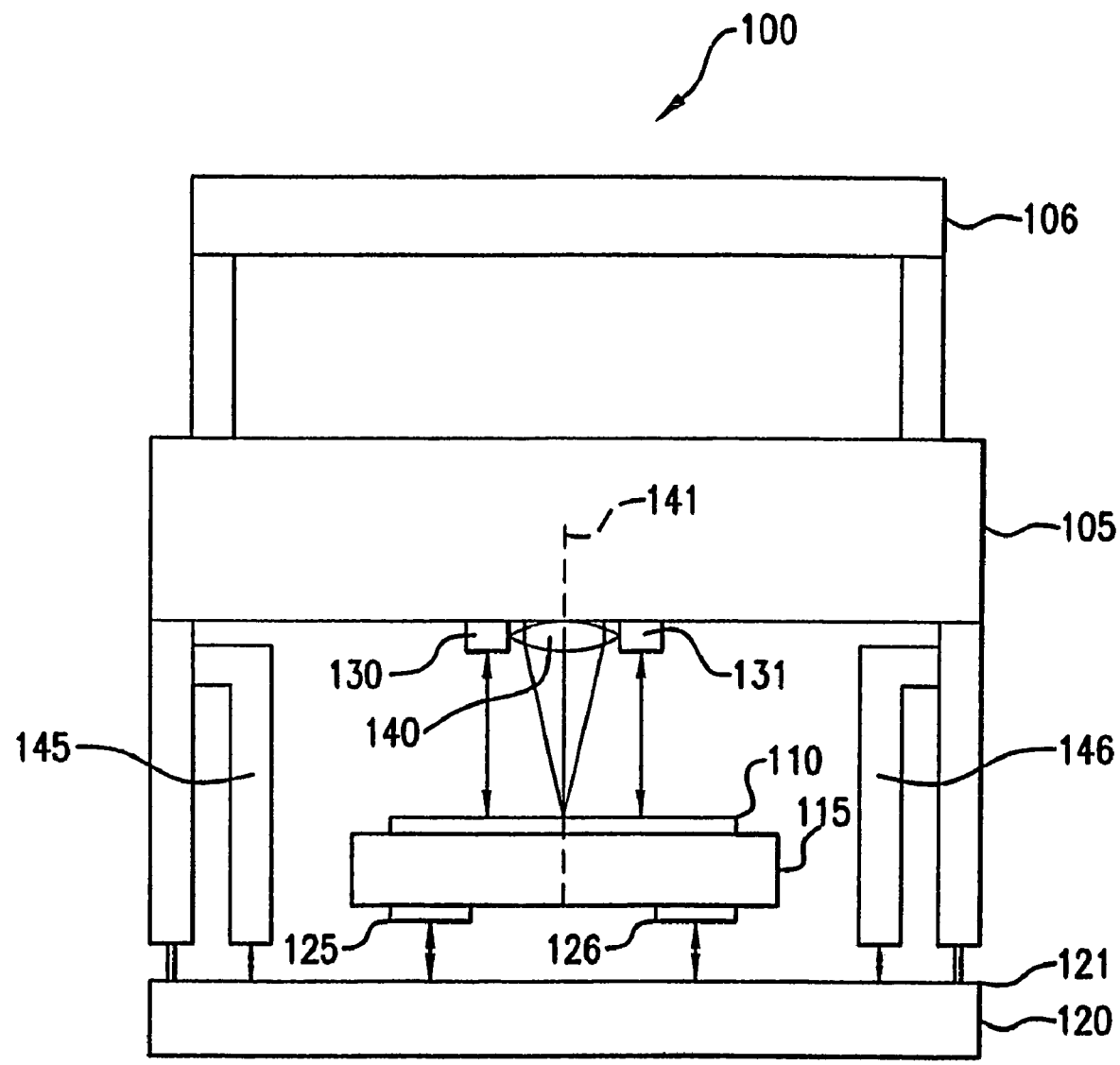
FIG. 1 is an illustration of a lithography apparatus that can be used in connection with the present invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

FIG. 1 illustrates a lithography apparatus 100. Lithography apparatus 100 includes projection optics 105. Projection optics 105 can include the elements necessary to project an image of a reticle (not shown) held by a reticle stage 106 onto a wafer 110. Wafer 110 can be a semiconductor wafer, or any other substrate that can be lithographically processed. Wafer 110 is held in place by a chuck (not shown) on a wafer stage 115. The wafer stage 115 is disposed above a backplate 120 having an upper surface 121 that is a backplane, which serves as a positional reference that can be used by backplane servos (not shown) for moving the wafer stage 115 relative to the backplate 120. This movement can be monitored by backplane gauges 125, 126.

Distances between the projection optics 105 and the wafer 110 can be monitored by wafer surface gauges 130, 131. These wafer surface gauges 130, 131 are located on either side of an exposure lens 140. During lithographic processing, accurate knowledge of the distance between exposure lens 140 and wafer 110 along the axis of exposure (i.e., on-axis) 141 is desirable. However, on-axis measurements are difficult. The arrangement shown instead accomplishes off-axis measurements because the wafer surface gauges 130, 131 are located adjacent to, but off, the exposure axis. It should be noted, as would be apparent to one skilled in the relevant art, that an actual exposure lens has been depicted for illustration purposes to aid in the description of lithography apparatus 100, but the actual arrangement of the lens can differ from that shown without departing from the scope of the present invention.

Not shown but included within the structure of FIG. 1, are the necessary servos that effectuate wafer stage movement. As discussed above, these servos include one or more backplane servos that cause movement of the surface of the wafer relative to the exposure lens 140. Also included within the structure of FIG. 1 are stalk gauges 145 and 146. These stalk gauges monitor any movements of the backplate 120 relative to the projection optics 105. An example of these elements can be found in the Micrascan III tool, previously manufactured by Silicon Valley Group, Inc., 901 Ethan Allen Hwy, Ridgefield, Conn. 06877 (now ASML US Inc.).

Figure 2:
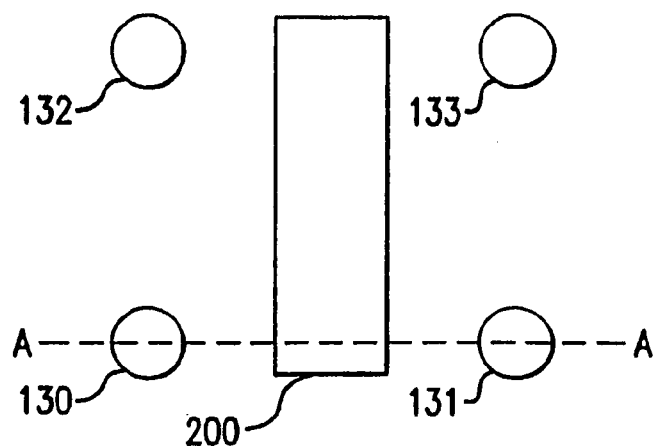
FIG. 2 is an illustration of wafer surface gauge and illumination slot layout within a lithography apparatus like that of FIG. 1.

FIG. 2 illustrates an exemplary arrangement of wafer surface gauges 130–133 in relation to an exposure slot 200. The exposure slot is the region in which the wafer is actually being exposed (or illuminated) at any given moment during a lithographic process. Wafer gauges 130–133 are situated about this slot in order to determine how far the wafer is from the exposure lens during processing. Off-axis measurements taken by the wafer gauges 130–133 can simply be averaged together to approximate on-axis distances. This technique introduces errors as discussed below in connection with FIG. 3, which illustrates a typical spatial arrangement taken along the cross-section A—A depicted in FIG. 2.

Figures 3A, 3B:
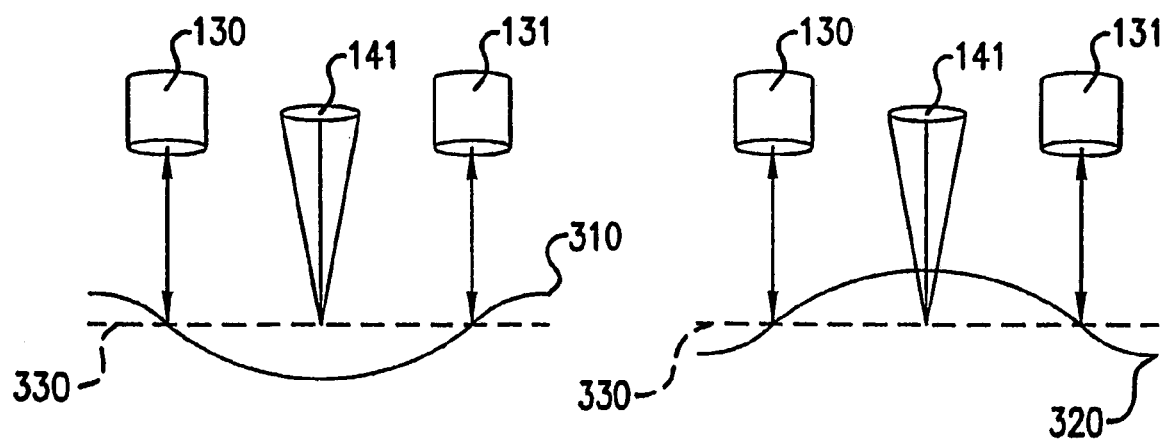
FIG. 3A is an illustration of a particular wafer surface and wafer surface gauge situation along the line A—A in FIG. 2.
FIG. 3B is another illustration of another particular wafer surface and wafer surface gauge situation also along the line A—A in FIG. 2.

In FIG. 3A, an exemplary non-planar wafer surface 310 is depicted together with wafer surface gauges 130, 131 and exposure lens 141. Due to the measurements taken by wafer surface gauges 130 and 131, the desired focal plane has been determined to be along dotted line 330. This makes sense to the system since both surface gauges "see" the wafer surface at dotted line 330, and so the system assumes that these off-axis measurements correspond to the on-axis dimension. However, due to the contour at the actual wafer surface 310, the on-axis dimension differs significantly from the off-axis measurements. Thus, the system will have a focus set for dotted line 330 instead for wafer surface 310 in the arrangement depicted in FIG. 3A.

FIG. 3B is an illustration of an arrangement similar to that shown in FIG. 3A. In the arrangement of FIG. 3B, wafer surface 320 exhibits an increase in height between the wafer surface gauges 130, 131. Thus, as in the arrangement of FIG. 3A, the situation shown in FIG. 3B results in a focus setting that assumes a wafer surface at 320, rather than at 330.

In both of the situations shown in FIGS. 3A and 3B, the desired focal plane has been indicated at dotted line 330. The determination of where the desired focal plane is set is based on the particular tool as well as the particular environment in which the particular tool is being used. The determination of the precise location of the desired focal plane is beyond the scope of this invention. Methods for such determination are known to those skilled in the art, and so will not be described in more detail herein.

As used herein, the term "focus set-point" means the dimension between the exposure lens and an on-axis point on the surface of the wafer when that point is at the desired focal plane. This dimension is also referred to by those skilled in the relevant art as the "separation distance."

Thus, as has been described above, the use of wafer surface gauges on either side of the axis of exposure is insufficient to accurately determine the appropriate focus setting on the axis of exposure. The present invention overcomes the shortcomings discussed above by coordinating measurements taken by the wafer surface gauges, movements of the wafer stage, and open loop corrections, in order to move the surface of the wafer at the axis of exposure to the desired focal plane. The present invention accomplishes this by making open loop moves based on information derived from off-axis sensors and placing a wafer in the correct focal plane in real time. Data on future exposure targets are acquired while ones under the lens are being exposed. A spatial delay line is employed, translating timed measurements to spatial ones in order to operate a widely varying scan speeds. A simple, one-dimensional version of this technique will be described below in connection with FIGS. 4A and 4B.

Figure 4A:
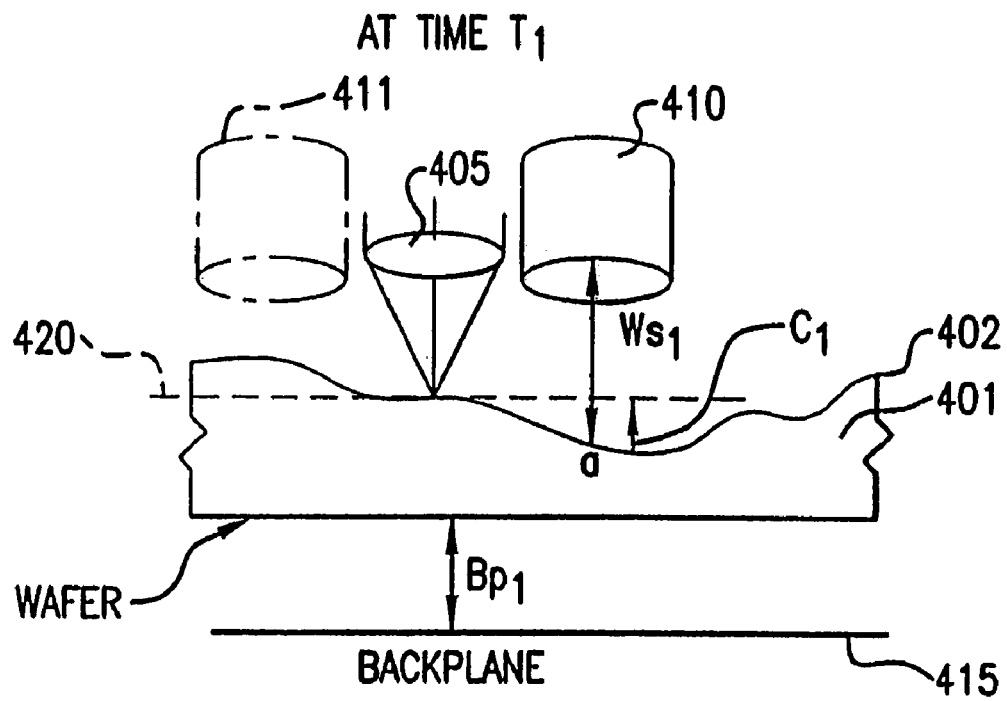
FIG. 4A is an illustration of a wafer surface being illuminated within a lithography apparatus at a first time.

FIG. 4A is an illustration of a wafer 401 with surface profile 402 being illuminated by lens 405. Included are a backplane 415 as well as wafer surface gauges 411 and 410. In FIG. 4A, wafer surface gauge 411 is shown as a dotted line because the present invention relies only on the use of one wafer surface gauge, depending on the direction of travel of the wafer. The desired focal plane is shown in FIG. 4A as dotted line 420.

FIG. 4A illustrates the situation at a first time T1. As seen in FIG. 4A, at time T1, the wafer is positioned correctly such that the surface of the wafer lies within the focal plane 420. Meanwhile, wafer surface gauge 410 is disposed above wafer position a. At time T1, the distance between wafer surface gauge 410 and the surface of the wafer 402 at location a is Ws1. Also at time T1, backplane gauges (not shown) measure the distance between the backplane 415 and a structure holding the wafer (not shown) as Bp1. By subtracting the focus set-point from Ws1, a correction dimension, C1, can be determined. Thus, at time T1, location a at the wafer surface 402 is a distance C1 too far from the desired focal plane 420, while the surface of the wafer directly below the exposure lens is within focal plane 420.

Figure 4B:
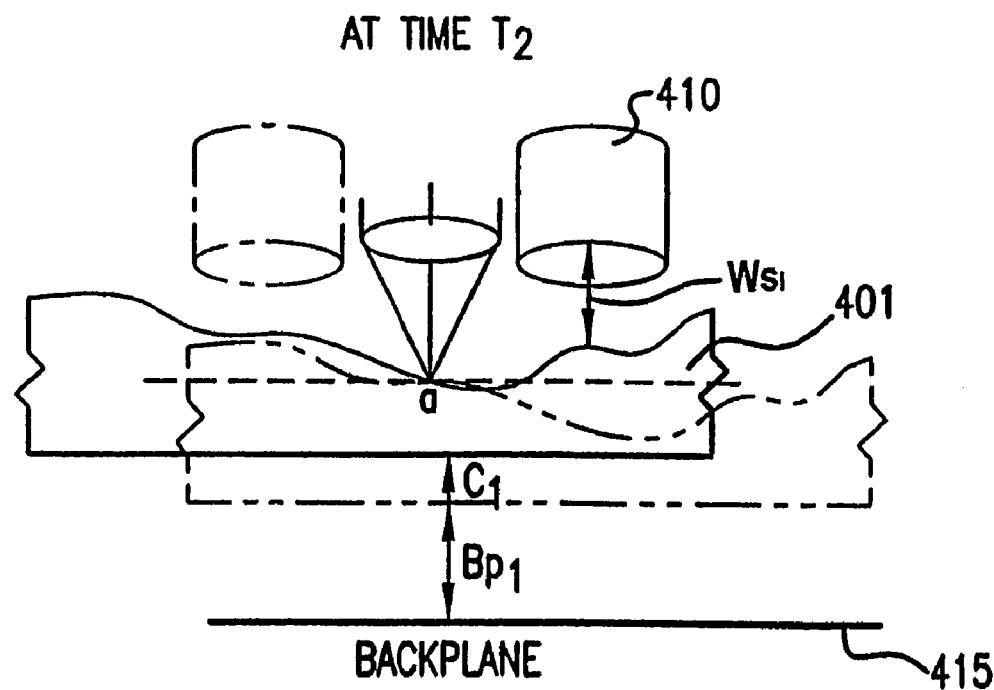
FIG. 4B is an illustration of the wafer surface shown in FIG. 4A being illuminated at a subsequent time.

FIG. 4B illustrates the structure of FIG. 4A at a second time T2 after an open loop correction has been made. At time T2, the wafer has been moved up away from the back plane 415 such that the separation of the back plane and the wafer is now equal to Bp1+C1. In this way, wafer surface location a is now within focal plane 420. This adjustment is referred to as an open loop adjustment, because the system does not take any wafer surface measurements relevant to position a at time T2. Instead, at time T2, wafer surface gauge 410 measures a second dimension at another wafer surface location, that dimension being indicated as Ws1. This dimension will be used in a similar manner as to that which dimension Ws1 was used in order to make the open loop correction shown in FIG. 4B.

Thus, as has been shown in connection with FIGS. 4A and 4B, the present invention uses open loop corrections that are correlated with wafer movement in order to place the wafer surface location being illuminated into the desired focal plane. While FIGS. 4A and 4B illustrate a simple, one-dimensional system, the present invention is adaptable to a full range of motion, for example in six degrees of freedom.

The present inventor has discovered that by converting time-domain measurements into space-domain measurements, the appropriate corrections can be made. This will be discussed more fully below in connection with FIG. 5.

Figure 5:
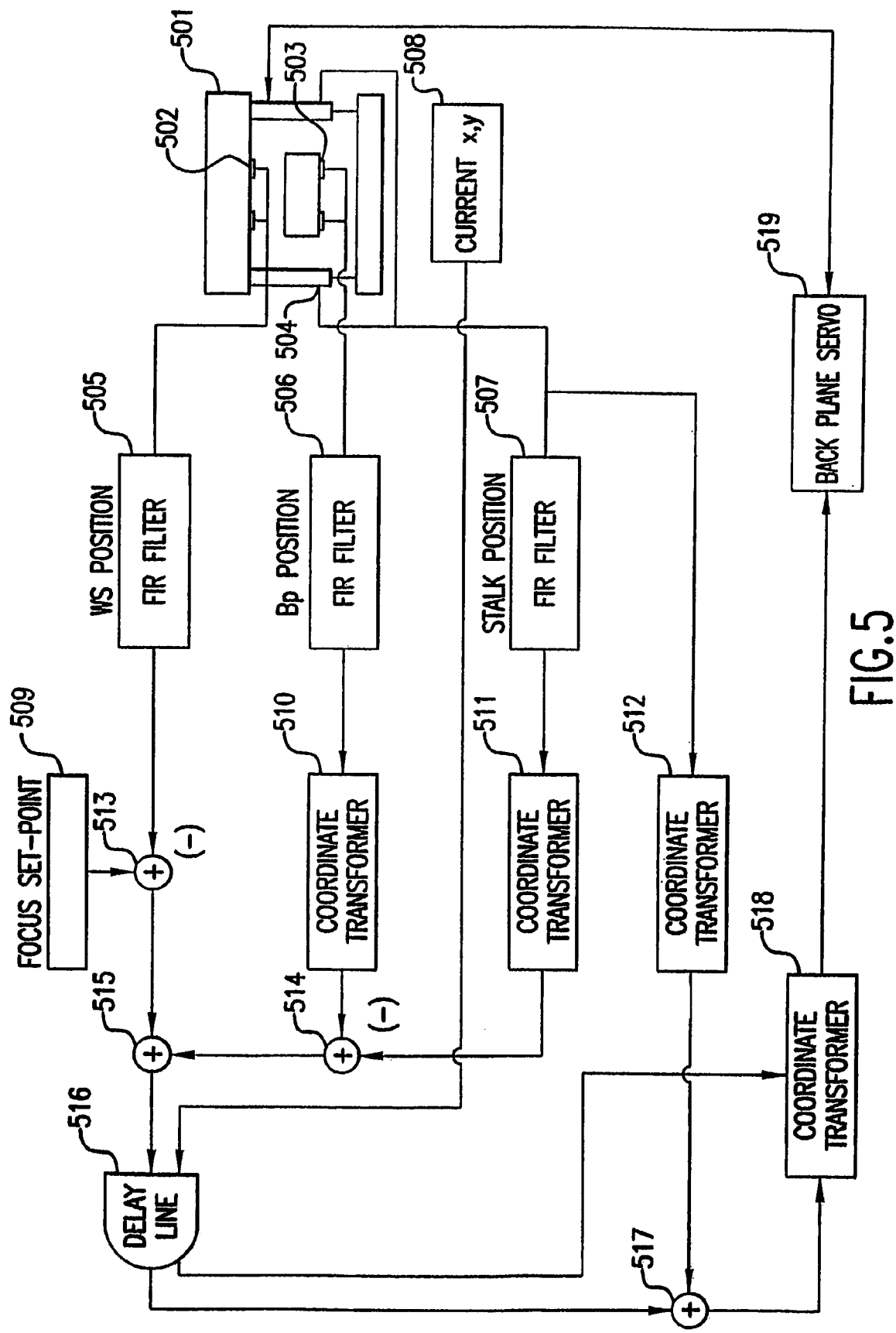
FIG. 5 is an illustration of a system according to the present invention.

FIG. 5 is an illustration of a high-level block diagram of a virtual gauging system according to the present invention. A lithography apparatus 501 like that shown in FIG. 1 is included in the system. Lithography apparatus 501 includes wafer surface gauges 502, back plane gauges 503, and stalk gauges 504. As with the lithography apparatus 100 of FIG. 1, the actual number of gauges used within the lithography apparatus 501 illustrated in FIG. 5 is not limited by the particular structure shown. For example, while only two stalk gauges 504 are illustrated in FIG. 5 (as well as in FIG. 1), the number of stalk gauges may vary. For example, in a preferred embodiment of the present invention, three stalk gauges are included so that the backplane location relative to the projection optics can be determined accurately. Likewise, while only two wafer surface gauges 502 are shown, more can be used, as would be apparent to one skilled in the relevant art given this description.

The outputs of the various gauges used are each input into an associated finite-impulse-response (FIR) filter. Specifically, outputs from wafer surface gauges 502 are input into FIR filter 505, outputs from backplane gauges 503 are input to FIR filter 506, and outputs from stalk gauges 504 are input into FIR filter 507.

The time-domain measurements coming from the various gauges are converted into space-domain measurements. In other words, instead of measurements being related to stage locations at a snapshot in time, measurements coming out of the various FIR filters are instead related to predetermined spatial movements of the wafer stage. Thus, instead of having measurements corresponding to every half second in time, the measurements out of the FIR filters can correspond to every half-millimeter of stage movement, for example. Also included within the structure of FIG. 5 is an input for the current x,y position of the wafer stage 508. The current x,y position of the wafer stage 508 is determined from mechanisms that drive the wafer stage along with additional sensors associated with those mechanisms, not shown in the figures. Such sensors determine the x,y position of the wafer stage with interferometers similar to those used for the gauges described in connection with FIG. 1.

Additionally input into the system of FIG. 5 is the focus set-point 509. As discussed above, the focus set-point 509 is the dimension at which the surface of the wafer needs to be separated from the exposure lens in order to put the wafer surface into the desired focal plane.

In order to add and/or subtract various dimensions together in the manner described, for example, in connection with FIGS. 4A and 4B, all dimensions need to be characterized in terms of a single coordinate system. Thus, boxes labeled coordinate transformer, 510, 511 and 512, are used to transform the various dimensions received into a single coordinate system, for example the wafer surface gauge positions. Thus, the output from the wafer surface position FIR filter 505 does not need to be transformed, while the output from the back plane position FIR filter 506 as well as the stalk position FIR filter 507 both need to be transformed into the coordinates of the wafer surface positions. In this way, all of the dimensions can be expressed simply in terms of the wafer surface position. Following the computation symbols (each of which can be implemented as a computational element) included within FIG. 5, it can be seen that the output from the wafer surface position FIR filter 505 is subtracted from the desired focus set-point 509, as indicated at computational element 513. Meanwhile, the output of stalk position FIR filter 507, after being transformed at 511, is subtracted from the output from the backplane FIR filter 506, after being transformed at transformer 510. This is indicated at computational element 514. This sum is then added to the focus set-point and wafer stage position computation that was performed at 513. The sum calculated at computational element 515 in the system shown in FIG. 5 will next be described in terms of the structure shown in FIGS. 4A and 4B. The calculation of the dimension C1 in FIG. 4A is determined at computational element 513 in FIG. 5, since at computational element 513, the wafer surface position is subtracted from the focus set-point. This computation is analogous in FIG. 4A to determining the difference between Ws1 and the focus set-point. Then, in order to figure out the dimensions shown in FIG. 4B, Bp1+C1, the dimension C1, which was calculated at computational element 513 in FIG. 5, must then be added to the dimension Bp1, which is essentially the current location of the back plane in terms of the wafer surface. Thus, the computation at point 515 in FIG. 5 is simply the addition of the backplane location with the desired offset to correct for the wafer surface irregularity at a first point.

As can be seen in FIG. 5, also included is the computation of a stalk position sum at computational element 514. The sum calculated at 514 is used to add any variation in position between the backplane and the projection optics as determined by the stalk gauges.

Delay line 516 thus has as inputs the desired backplane location in order to put the wafer surface at the proper focus set point, as well as the current x,y position associated with the particular place on the wafer surface corresponding to the desired backplane location. Delay line 516 will thus include a number of x,y positions as well as necessary backplane dimensions associated with those positions.

It should be noted that the delay line is a collection of correction data that can be characterized as having a spatial, rather than temporal, delay. Thus, if the delay line represents, for example, a 9.5 mm delay, and if the wafer surface gauge is 9.5 mm away from the axis of exposure, then the output of the delay line will be the necessary backplane location at the current exposure axis.

The output of delay line 516 is combined with the current stalk gauge readings at computational element 517. Computation 517 is included within the system shown in FIG. 5 because the location of the backplane relative to the projection optics may have changed during the previous 9.5 mm (for example) movement of the wafer stage. This real-time stalk compensation computation 517 is then used within a coordinate transformer 518 along with the original output of delay line 516 in order to drive a backplane servo 519.

Backplane servo 519 moves the wafer stage such that the backplane is the desired distance from the rear of the wafer stage, as determined from the output of the delay line 516. In this way, again returning to FIGS. 4A and 4B, the movement between the arrangement shown in FIG. 4A and the arrangement shown in FIG. 4B can be accomplished. While FIG. 5 has illustrated a high-level view of the present invention, FIGS. 6A and 6B illustrate a more detailed view.

Figure 6A:
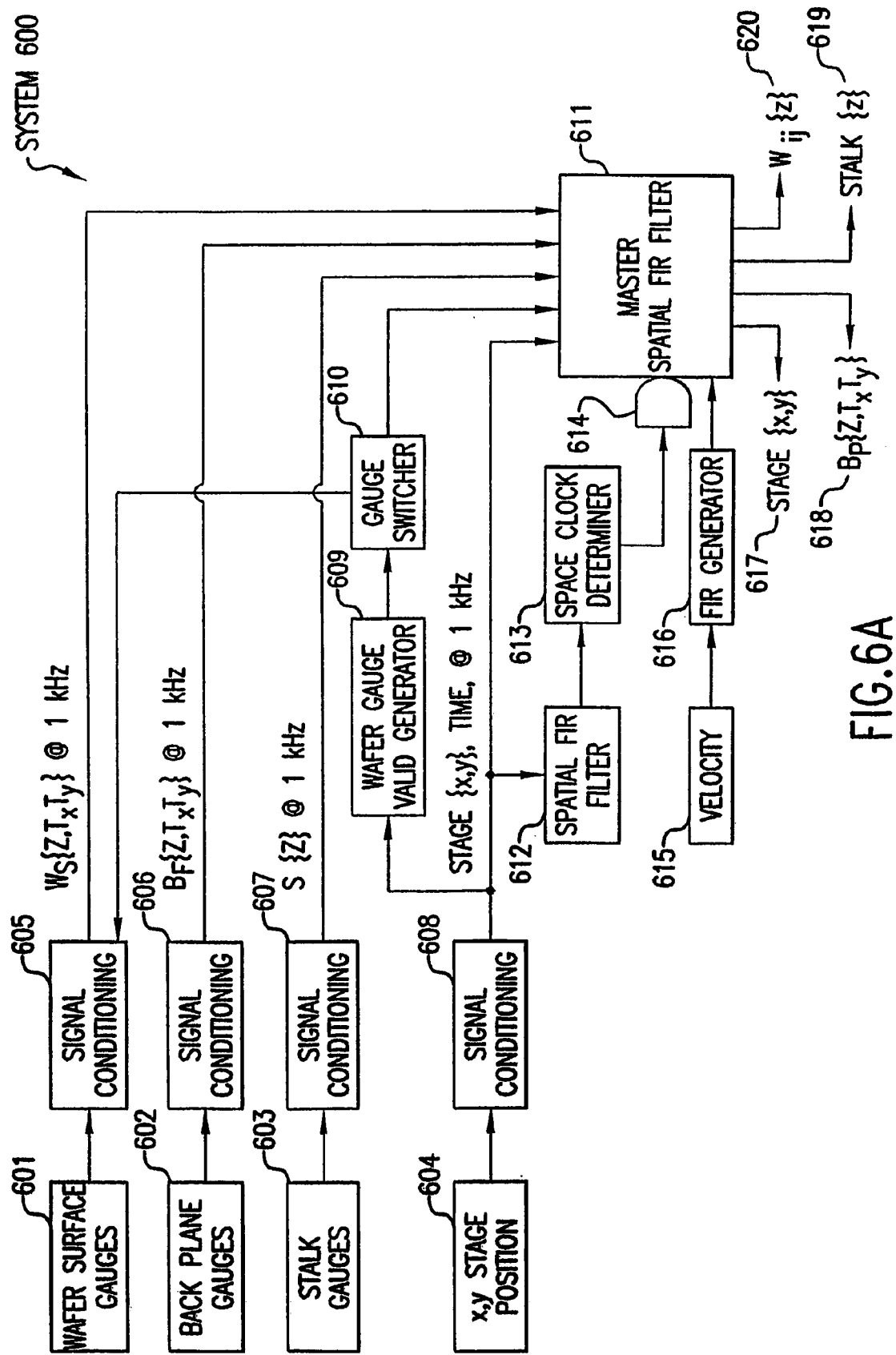
FIG. 6A is a detailed illustration of a first portion of a system according to the present invention.
Figure 6B:
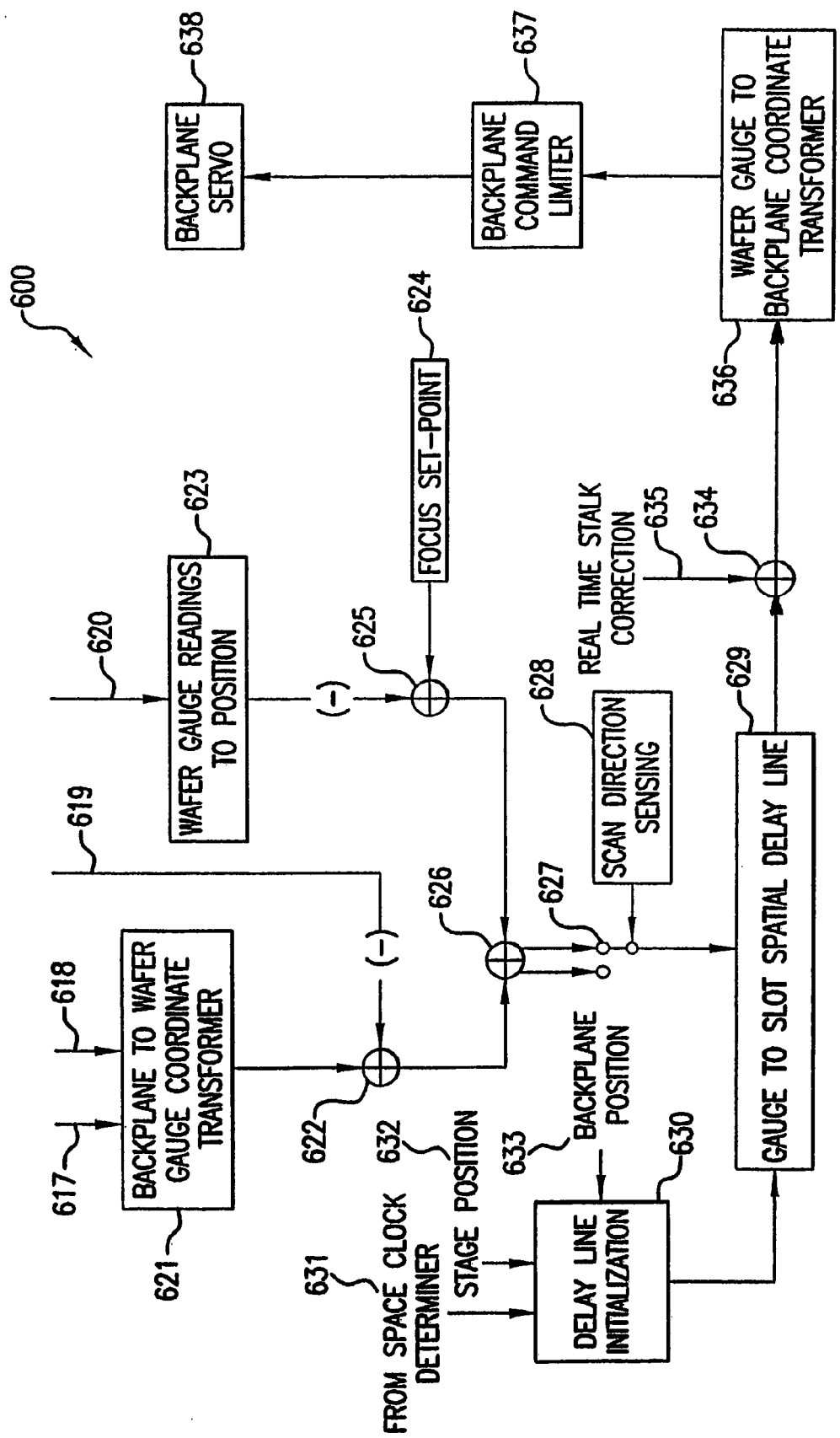
FIG. 6B is a detailed illustration of a second portion of the system of FIG. 6A according to the present invention.

FIG. 6A illustrates details of a portion of a system according to the present invention, with FIG. 6B illustrating the remainder of the system. System 600 includes wafer surface gauges 601. These wafer surface gauges 601 are analogous to the wafer surface gauges 130, 131 as shown in FIG. 1. Wafer surface gauges 601 can be alternating-current ("AC") capacitance gauges familiar to those skilled in the relevant art. The precise number of wafer surface gauges is not critical to the present invention and could be determined by one skilled in the relevant art. Typically, the output from wafer surface gauges 601 will be a 16 kHz AC signal.

System 600 also includes backplane gauges 602 as well as stalk gauges 603. As with the wafer surface gauges 601, backplane gauges 602 and stalk gauges 603 can be AC capacitance gauges. The output from the stalk gauges 603 is also typically a 16 kHz AC signal, while the output from the backplane gauges 602 is typically an 8 kHz AC signal. As with the wafer surface gauges 601, the precise number and operation of the backplane gauges 602, and the stalk gauges 603, can be determined by one skilled in the relevant art and is not critical to this invention.

The output from each of the set of gauges is subject to signal conditioning. For example, wafer surface gauges 601 are subject to signal conditioning 605. Signal conditioning 605 includes the components necessary to translate the 16 kHz AC signal into a one (1) kHz digital signal. Thus, signal conditioning 605 can include the necessary electronics to convert the AC data signal into digital positional information. Such digital information can be a 16 bit digital signal representative of the output from the wafer surface gauges 601. This digital signal can then be stepped down to a 1 kHz digital signal with a 500 Hz low pass finite impulse response decimation filter. Thus, the output from signal conditioning 605 will include Z elevational data as well as Tx and Ty data at one kHz. This data will be explained further in connection with FIG. 7.

Figure 7:
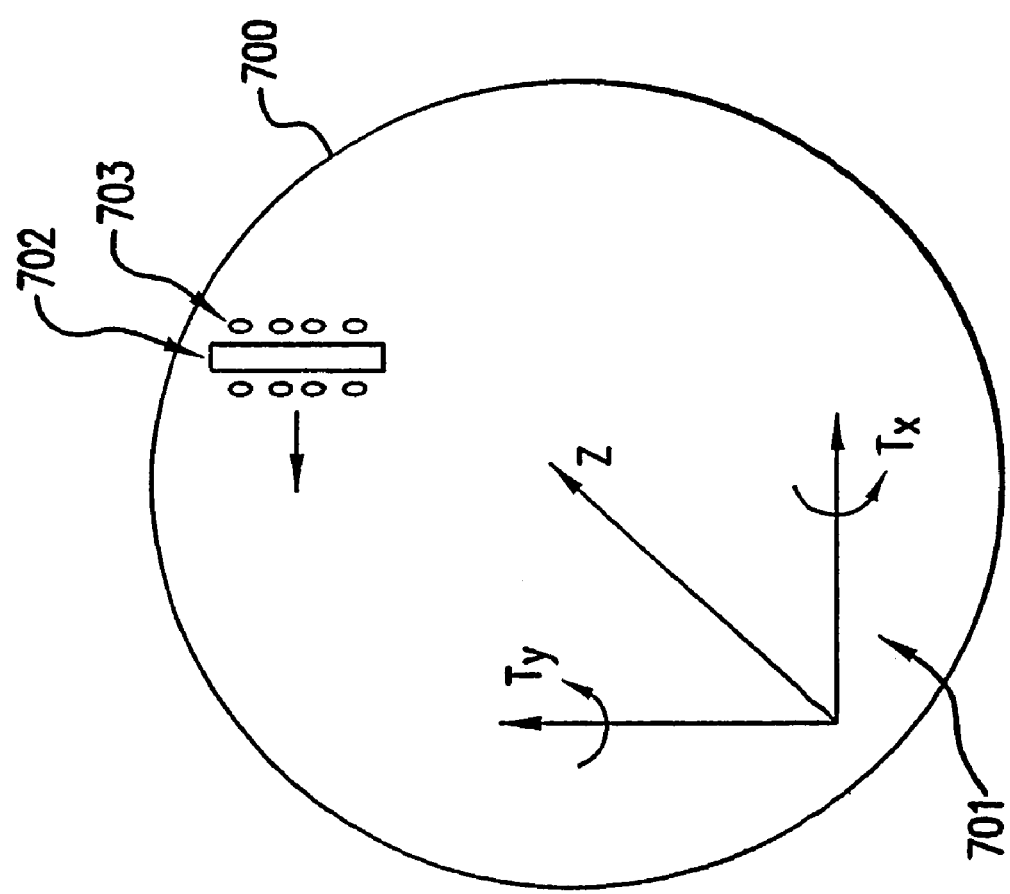
FIG. 7 is a diagram of a coordinate system that can be used in connection with the present invention.

FIG. 7 is an illustration of a coordinate system including dimensions within a lithographic system. The structure illustrated in FIG. 7 includes a wafer 700 as well as a coordinate system overlying that wafer 701. As depicted, an illumination slot 702 is being scanned across the wafer in an x direction. Also shown are wafer surface gauges 703 along the side of illumination slot 702. It should be noted that while eight wafer gauges are shown in FIG. 7, other numbers of gauges, for example four wafer gauges, can be used without departing from the scope of the present invention. As can be seen from coordinate system 701, the Z dimension is the dimension of elevation off the top surface of the wafer towards the illumination slot 702. Meanwhile, Ty is the rotational dimension about the Y axis, while Tx is the rotational dimension about the X axis. By characterizing the surface of the wafer in terms of the Z dimension as well as Ty and Tx, the system can determine the separation between the wafer surface and the exposure lens at any given point.

Thus, returning to FIG. 6A, the wafer surface gauges 601, backplane gauges 602, and stalk gauges 603 are all used to determine a Z dimension as well as, in the case of the wafer surface gauges 601 and the backplane gauges 602, Tx and Ty rotational dimensions.

Backplane gauges 602 are subject to signal conditioning 606, similar to the signal conditioning 605 conducted on the output of the wafer surface gauges 601. As with signal conditioning 605, signal conditioning 606 results in backplane data including Z data Tx data and Ty data at 1 kHz.

Stalk gauges 603 are also subject to signal conditioning 607. However, rather than producing Tx and Ty data for stalk gauges 603, signal conditioning includes the necessary components to output a single Z dimension at 1 kHz for the stalk gauges. Thus, the output from signal conditioning 607 is a 1 kHz signal representing the separation between the backplane and the projection optics along the exposure axis.

Also input to system 600 is x, y stage position 604. As described above in connection with FIG. 5, the x, y stage position 604 is the current x, y position of the wafer stage as monitored by sensors associated with the wafer stage servos. While x, y stage position 604 is shown as an additional input with two dimensions, this input could include an additional value corresponding to the reticle x dimension. Alternatively, this input could simply include one dimension such as the x dimension. The x, y stage position input 604 is used to monitor stage travel along a scanning axis. Thus, any desirable location information can be used. Whatever stage position information is used will ultimately drive the spatial interrupt that translates the timed measurements into spatially separated measurements. Thus, if the primary scan direction of the system 600 is along the x axis, then it is only necessary that the stage position be monitored in the x dimension.

The output from x, y stage position 604 is subject to signal conditioning 608. Signal conditioning 608 can correspond to the signal conditioning 605 through 607 discussed above. Signal conditioning 608 results in an output corresponding to stage position, for example an x position and a y position, at 1 kHz. Also output from signal conditioning 608 is a time signal corresponding to the output positional signal. The output from signal conditioning 608 is used both to drive a spatial interrupt as well as to control a wafer gauge valid generator 609 and a gauge switcher 610.

Because the system 600 according to the present invention needs to use only a leading gauge during scanning operation, it is necessary for the system to know which gauge is the leading gauge. Referring to FIGS. 4A and 4B, the leading gauge in the system illustrated in those figures is gauge 410. Thus, the output from gauge 411 is irrelevant. This is because the scan direction in the structure shown in FIGS. 4A and 4B is to the right and therefore gauge 410 is the leading gauge. Wafer gauge valid generator 609 determines from the stage position output from signal conditioning 608 in which direction the stage is moving, and thus which gauges are the leading gauges. Furthermore, at various times within the lithographic process, the wafer surface gauges are turned off in order to avoid saturation. This is accomplished by gauge switcher 610. Thus, outputs from gauge switcher 610 are fed back to signal conditioning 605 to turn off wafer surface gauges 601. Moreover, output from gauge switcher 610 is also fed into master spatial FIR filter 611. The output from gauge switcher 610 into master spatial FIR filter 611 includes a signal having one bit for each wafer surface gauge. The bits can be changed to indicate whether or not the data from a particular wafer surface gauge is valid.

Output from signal conditioning 608 corresponding to stage location is also fed into a spatial FIR filter 612. Spatial FIR filter 612 is used to constantly monitor stage location. This stage location is constantly fed to space clock determiner 613. Space clock determiner 613 uses output from spatial FIR filter 612 in order to translate movement of the stage into spatial interrupts 614. Thus, spatial FIR filter 612 and space clock determiner 613 work in conjunction to produce a spatial interrupt 614 upon regular movements of the stage. For example, in a typical system, spatial interrupts are desired with every one-half millimeter of movement of the wafer stage. Since the spatial FIR filter 612 is continuously monitoring stage position and feeding that position into space clock determiner 613, space clock determiner 613 waits until the wafer stage has moved one-half a millimeter since the last time a spatial interrupt 614 was fired. Once the wafer stage travels an additional, for example, one-half millimeter, the space clock determiner causes another spatial interrupt to fire. Thus, 614 represents an input to master spatial FIR filter 611 that includes a spatial interrupt that is fired at every one-half millimeter of movement of the wafer stage. These interrupts then control the output of master spatial FIR filter 611 that will be discussed with more detail below in connection with FIG. 6B.

Velocity information 615 is fed into FIR generator 616 and then into master spatial FIR filter 611. This velocity input can be used by master spatial FIR filter 611 to accommodate various speeds of wafer stage travel. However, velocity input into master spatial FIR filter 611 is not necessary for the present invention. The operation of master spatial FIR filter 611 will now be described.

Master spatial FIR filter 611 is a finite-impulse-response filter having a width adjusted for stage speed to match the physical width of the exposure lens. Signals fed into master spatial FIR filter 611 from the wafer surface gauges 601, backplane gauges 602, stalk gauges 603, and x, y stage position 604 are buffered within master spatial FIR filter 611. A positional signal is chosen as a driver, for example the x stage position. The velocity input to master spatial FIR filter 611 from FIR generator 616 is used to control the width of the master spatial FIR filter 611. When an interrupt is received from the space clock determiner 613 at 614, master spatial FIR filter 611 uses velocity data from FIR generator 616 to output positional information.

Positional information output from master spatial FIR filter 611 includes stage position 617. Stage position 617 can include an x coordinate, y coordinate, and any other stage positional coordinate desired, as discussed above. Also output from master spatial FIR filter 611 is backplane information 618. Backplane information 618 includes Z axis data as well as Tx and Ty data. Also output from master spatial FIR filter 611 is stalk data 619. Stalk data 619 includes Z axis data. Finally, output from master spatial FIR filter 611, is wafer surface data 620. Wafer surface data 620 includes Z axis data for each wafer surface gauge. Thus, the label Wij is meant to include a Z axis data value for each such wafer surface gauge.

The portion of the system 600 shown in FIG. 6A thus represents the inputs to master spatial FIR filter 611, the operation of master spatial FIR filter 611, as well as the outputs from that filter. Briefly stated, whenever a spatial interrupt is received from space clock determiner 613 at 614, master spatial FIR filter 611 outputs the current stage location as well as the backplane location, the stalk dimensions, and the wafer surface gauge dimensions. Thus, master spatial FIR filter 611 serves to translate data from the time domain to data in the space domain. The data output from master spatial FIR filter 611 can then be used by other portions of system 600, as will be described below in connection with FIG. 6B.

FIG. 6B illustrates additional components within system 600. Specifically, FIG. 6B illustrates those components within system 600 on the output side of master spatial FIR filter 611. Thus, inputs 617, 618, 619 and 620 in FIG. 6B correspond to like numbered outputs from FIG. 6A.

In the structure shown in FIG. 6B, stage position data 617 and backplane position data 618 are input into a backplane to wafer gauge coordinate transformer 621. Coordinate transformer 621 transforms backplane coordinates into corresponding left and right wafer gauge coordinates. Thus, the output from coordinate transformer 621 corresponds to the backplane information in terms of both wafer gauge left and wafer gauge right positional data.

Stalk data 619 is then subtracted from the output of coordinate transform 621 at a computational element 622. Meanwhile, wafer surface gauge data 620 is transformed into wafer gauge positional data at 623. This transformation involves taking the various wafer gauge data points corresponding to the various wafer gauges and producing both left and right wafer gauge data sets including Z axis data as well as Tx data for all wafer gauge sensors that are valid. Again, wafer gauge validity is determined as described elsewhere herein in connection with wafer gauge valid generator 609 of FIG. 6A. The positional information output from 623 is then subtracted from focus set point 624 at computational element 625. Thus, the output from computation 625 includes wafer gauge corrections for both left and right wafer gauges. In other words, data output from computation 625 includes a left Z correction and a left Tx correction, as well as a right Z correction and a right Tx correction. The output from computation 625 is then added to the output from previously described computation 622 at computational element 626.

The output from computational element 626 thus includes both right data and left data. Both the right data and the left data include Z correction data Tx correction data, x data, y data, as well as other data as can be determined by one skilled in the relevant art given this description.

A switch 627 is then used to select between left and right data based on scan direction sensing 628. Scan direction sensing 628 is simply an element that uses, for example, stage positional information to determine in which direction the stage is traveling and sets switch 627 accordingly. Again, the present invention relies on only data collected from the leading gauges, and so it is necessary to determine which gauges are the leading gauges.

Output from switch 627 is fed into the gauge to slot spatial delay line 629. Gauge to slot spatial delay line, or the spatial delay line, 629 is simply a continuous loop, or buffer, of data that stores correctional information received from switch 627. Thus, entries within spatial delay line 629 include stage position information together with correction information. Spatial delay line 629 delays outputting information from switch 627 until the stage has moved to the desired location. For example, assume a situation where correction information has been generated at positions 100 mm, 101 mm, 102 mm, etc. and inserted into delay line 629. Further assume that the leading gauge to lens distance is 9.5 mm. When the stage is at 91.5 mm, the delay line will output data determined at stage position 101, since 91.5+9.5 equals 101. For stage positions in between the fixed delay lines positions, the commands can adopt a straight line interpolation.

Proper output is derived from the delay line 629 in the following fashion. The present stage position, adjusted for the gauge to lens distance, is used as a basis for searching the delay line 629 for the appropriate correction to be sent. This is done by examination of the stage position information in the delay line 629 which represents the stage position reference used when the correction was computed.

Spatial delay line 629 includes as an additional input delay line initialization 630. The purpose of delay line initialization 630 is to fill spatial delay line 629 with data upon start-up of the system. Delay line initialization 630 includes an input 631 from space clock determiner 613, discussed above in connection with FIG. 6A. Input signal 631 is a signal that indicates that the space clock determiner 613 has sent its first interrupt to master spatial FIR filter 611. The occasion of the first interrupt thus marks the start of the system. Delay line initialization 630 also receives as inputs current stage position 632 and backplane position 633. Stage position signal 632 comes from the output of signal conditioning 608, discussed above in connection with FIG. 6A, while backplane position 633 comes from the output of signal conditioning 606, also described above in connection with FIG. 6A. With these inputs, delay line initialization 630 fills spatial delay line 629 with data. This data is merely space filler data used within spatial delay line 629 to prevent erroneous corrections. Thus, the specific delay line initialization inputs into spatial delay line 629 are not critical and could be determined by one skilled in the relevant art given this disclosure.

Output from spatial delay line 629 thus includes current correction data. This data represents the current wafer correction necessary to place the surface of the wafer within the desired focal plane. In order to accommodate any structural changes that may have taken place between the time at which the data was initially captured and the time that has passed since, real-time stalk correction takes place at 634. Input 635 into real-time stalk correction at 634 is taken from the output of signal conditioning 607. Thus, any time variations in the distance between the projection optics and the backplane as measured by the stalk gauges is factored in at 634 by adding the data as indicated in FIG. 6B.

After computation 634, correction data includes the following: Z coordinate, Tx coordinate, Ty coordinate, and stage position (x, y). This correction data is then fed into wafer gauge to backplane coordinate transformer 636. Coordinate transformer 636 produces as outputs backplane correction information including Z data, Tx data, and Ty data, all in terms of backplane location. This data is then fed into backplane command limiter 637.

Backplane command limiter 637 is a safety feature that prevents collisions within the system 600. Backplane command limiter 637 includes the limitations on backplane movement and prevents any correction command from exceeding those backplane limitations. Thus, backplane command limiter 637 is not necessary, but is preferred.

Next, the correction data is sent to backplane servo 638. Backplane servo 638 includes the necessary drive and compensation components familiar to those skilled in the relevant art. Backplane servo 638 produces within it the necessary signals to drive servo motors that move the wafer into the correct position as indicated by the correction data. For example, servo 638 includes feedback indicating current backplane position in order to move the wafer to the desired location. Current backplane position is taken from the output of signal conditioning 606, described above in connection with FIG. 6A. By subtracting current backplane position information from the correction position information, a correction command results within the servo. Thus, if the correction data is the same as the current backplane position, no correction command results.

Figure 8:
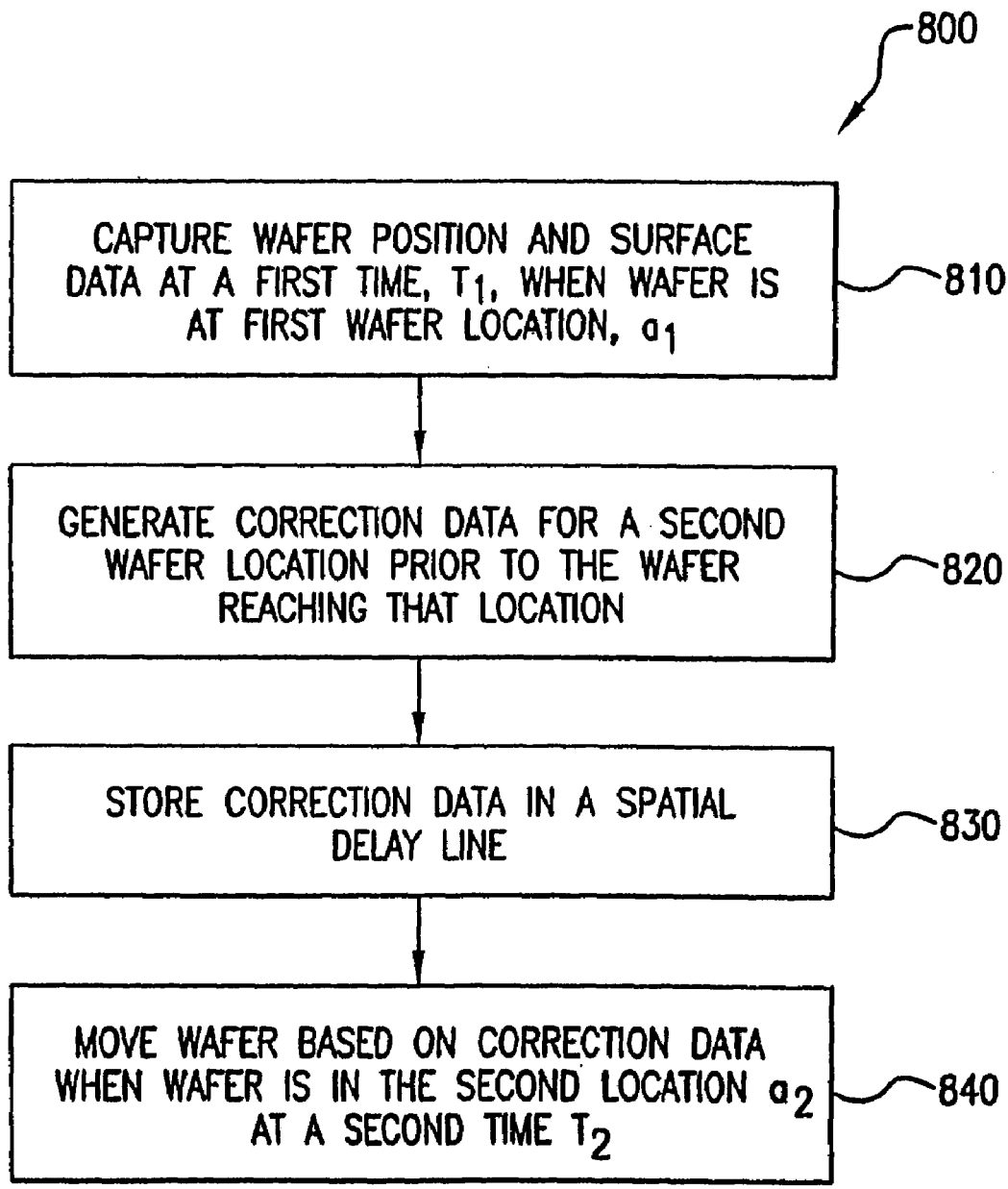
FIG. 8 is an illustration of a method of virtual gauging according to the present invention.

A system as described herein can be used in a method of virtual gauging like that shown in FIG. 8. FIG. 8 illustrates a method of virtual gauging 800 in accordance with the present invention. In a first step 810, wafer position and surface data are captured at a first time, T1 when the wafer is at a first wafer location, a1.

In a next step 820, correction data is generated for a second wafer location prior to the wafer reaching that location. This step involves inputting the data collected in step 810, after being appropriately modified, into a spatial FIR filter like that described in connection with the embodiments above, for example a spatial FIR filter like master FIR filter 611 described in connection with FIG. 6A. This data is output from the spatial FIR filter in response to spatial interrupts generated in the manner described elsewhere herein. After being output, the data is then subjected to coordinate modification such that all the data is within the same coordinate system. Once all the data has been put into the same coordinate system, it can then be combined together in the manner discussed above in connection with the system of the present invention. Once the correction data has been so generated, it is stored in a spatial delay line, in a next step 830.

In a final step 840, the wafers move based on correction data when the wafer is in the second location a2 at a second time T2. It should be noted in connection with this final step that it is not necessary that the wafer already be in the final location before it is moved in response to the correction data. In other words, the wafer stage can be moving the wafer into the next position while it is at the same time responding to the correction data corresponding to that next position that has been previously stored in the spatial delay line.

A system and method like that discussed herein can be implemented with hardware, software, or firmware using components known to those skilled in the relevant art(s). For example, a processor within a general purpose computer can be used to implement a system and to perform a method like that disclosed herein, with respect to those elements (e.g., computational elements, coordinate transformers, etc.) that are not otherwise defined herein.

CONCLUSION

While various embodiments of the present invention have been described above, it should be understood that they have been presented by way of example only, and not limitation. For example, while the invention has been described in terms of a wafer, one skilled in the art would recognize that the instant invention could be applied to any type of substrate used in a lithography process. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A virtual gauging method for use in a lithographic process comprising the steps of:
   gauging a region at a surface of a wafer when the region is located away from an axis of illumination producing wafer surface data, while other portions of the wafer are being illuminated;
   acquiring time-domain measurements representing the wafer surface data;
   converting the time-domain measurements into space-domain measurements; and
   converting the space-domain measurements into wafer correction data.

2. The virtual gauging method of claim 1, further comprising the step of:
   adjusting a separation distance between an exposure lens and the region at the surface of the wafer based on the wafer correction data when the region is located at the axis of illumination.

3. The virtual gauging method of claim 1, wherein said gauging a region step comprises gauging a region from at least two wafer surface gauges located on opposite sides of an illumination slot.

4. The virtual gauging method of claim 3, wherein said converting the space-domain measurements step comprises:
   determining a direction of travel of the wafer,
   wherein the wafer correction data is based on data produced by one of the at least two wafer surface gauges located on a side of the illumination slot that corresponds to the direction of travel of the wafer.

5. The virtual gauging method of claim 1, wherein said converting the time-domain measurements step comprises:
   converting the time-domain measurements into space-domain measurements using a finite-impulse-response filter.

6. The virtual gauging method of claim 5, wherein said converting the time-domain measurements step comprises:
   triggering the finite-impulse-response filter with a spatial interrupt; and
   modifying a width of the finite-impulse-response filter in response to a velocity of travel of the wafer.

* * * * *

UNITED STATES PATENT AND TRADEMARK OFFICE
CERTIFICATE OF CORRECTION

| | | |
|---|---|---|
| PATENT NO. | : 7,049,618 B2 | Page 1 of 1 |
| APPLICATION NO. | : 11/256938 | |
| DATED | : May 23, 2006 | |
| INVENTOR(S) | : Joseph H. Lyons | |

It is certified that error appears in the above-identified patent and that said Letters Patent is hereby corrected as shown below:

On the Title page, above the application number, the phrase --This patent is subject to a Terminal Disclaimer.-- should be inserted.

Signed and Sealed this

Second Day of January, 2007

JON W. DUDAS
*Director of the United States Patent and Trademark Office*